United States Patent
Mariotto et al.

(10) Patent No.: US 9,761,745 B2
(45) Date of Patent: *Sep. 12, 2017

(54) DEVICE FOR REGULATING THE LEVEL OF MOISTURE IN A CONCENTRATING SOLAR MODULE AND SOLAR MODULE COMPRISING AT LEAST ONE SUCH DEVICE

(71) Applicant: Commissariat à l'énerige atomique et aux énergies alternatives, Paris (FR)

(72) Inventors: Mathieu Mariotto, La Motte-servolex (FR); Florian Degabriel, Fontaine (FR); Thibaut Faucon, Sainte Marguerite sur Duclair (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 198 days.

This patent is subject to a terminal disclaimer.

(21) Appl. No.: 14/413,640
(22) PCT Filed: Jul. 5, 2013
(86) PCT No.: PCT/EP2013/064299
§ 371 (c)(1),
(2) Date: Jan. 8, 2015
(87) PCT Pub. No.: WO2014/009288
PCT Pub. Date: Jan. 16, 2014

(65) Prior Publication Data
US 2015/0136201 A1    May 21, 2015

(30) Foreign Application Priority Data
Jul. 9, 2012    (FR) ..................... 12 56589

(51) Int. Cl.
*H01L 31/024* (2014.01)
*F24J 2/08* (2006.01)
*F24J 2/46* (2006.01)
*H01L 31/054* (2014.01)
(Continued)

(52) U.S. Cl.
CPC ............ *H01L 31/024* (2013.01); *F24J 2/085* (2013.01); *F24J 2/4618* (2013.01);
(Continued)

(58) Field of Classification Search
CPC .... H01L 31/024; H01L 31/0543; H02S 40/22
(Continued)

(56) References Cited

U.S. PATENT DOCUMENTS

2007/0295384 A1    12/2007 Uozumi
2009/0173376 A1    7/2009 Spencer
(Continued)

FOREIGN PATENT DOCUMENTS

DE    10-2010-021426 A1    12/2011
EP    0 014 657 A1    8/1980
(Continued)

OTHER PUBLICATIONS

Search Report issued in French Patent Application No. FR 12 56589 dated Mar. 18, 2013.
(Continued)

*Primary Examiner* — Jayne Mershon
(74) *Attorney, Agent, or Firm* — Pearne & Gordon, LLP

(57) ABSTRACT

A concentrating solar module comprising a device (D) for managing the moisture contained in a casing (2) of the module (M). The device comprises a housing (12) one of the walls (14) of which is provided with a window (15), a moisture absorbing material provided in the housing (12), a shield (28) provided facing the window (15) and distant therefrom so as to provide a space for the air flow between the window (15) and the shield (28), the shielding means (28) protecting the absorbing material from the concentrated solar radiation. The device is attached to a side wall (4) of the casing (2) such that said window (15) faces an aperture (16) provided inside said side wall (4) ensuring with said window (15) a fluid communication with the internal volume of the module and the shielding means (28) being located inside the solar module (M).

24 Claims, 9 Drawing Sheets

(51) Int. Cl.
*H02S 40/22* (2014.01)
*H02S 40/00* (2014.01)
(52) U.S. Cl.
CPC .......... *H01L 31/0543* (2014.12); *H02S 40/00* (2013.01); *H02S 40/22* (2014.12); *Y02E 10/43* (2013.01); *Y02E 10/52* (2013.01)
(58) Field of Classification Search
USPC ........................................................ 136/251
See application file for complete search history.

(56) References Cited

U.S. PATENT DOCUMENTS

| 2011/0154683 | A1 | 6/2011 | Vogt |
| 2013/0036909 | A1* | 2/2013 | Menard ............... B01D 53/261 95/91 |
| 2013/0233514 | A1 | 9/2013 | Mariotto |

FOREIGN PATENT DOCUMENTS

| EP | 0 546 481 | A1 | 6/1993 |
| EP | 2 088 631 | A1 | 8/2009 |
| FR | 2 292 202 | A1 | 6/1976 |
| FR | 2 462 670 | A1 | 2/1981 |
| FR | 2 481 427 | A1 | 10/1981 |
| WO | 2008/045187 | A2 | 4/2008 |
| WO | 2009/063102 | A1 | 5/2009 |
| WO | 2009/080847 | A1 | 7/2009 |
| WO | 2011/015483 | A2 | 2/2011 |
| WO | 2011/085086 | A2 | 7/2011 |

OTHER PUBLICATIONS

International Search Report issued in Application No. PCT/EP2013/064299 dated Nov. 11, 2013.
Written Opinion issued in Application No. PCT/EP2013/064299 dated Nov. 11, 2013.
Sarah Kurtz, "Opportunities and Challenges for Development of a Mature Concentrating Photovoltaic Power Industry" NREL, Technical Report, Nov. 2012.
A. Vogt et al., "Degradation Studies on Flatcon Modules and Assembles" 21st European Photovoltaic Solar Energy Conference, Sep. 2006.

* cited by examiner

DEVICE FOR REGULATING THE LEVEL OF MOISTURE IN A CONCENTRATING SOLAR MODULE AND SOLAR MODULE COMPRISING AT LEAST ONE SUCH DEVICE

TECHNICAL FIELD AND PRIOR ART

The present invention relates to a device for controlling the moisture level in a concentrating solar module and a solar module comprising at least one such device.

Concentrating photovoltaic systems have been increasingly developed because of a significant increase in the yields of the triple junction cells they use to convert a concentrated solar energy into electrical energy.

A concentrating photovoltaic system comprises modules made up of a casing the upper bottom of which made up of one or more Fresnel lenses which concentrate the incident solar flux and the lower bottom of which acts as a support to one or more photovoltaic cells. The system comprises a floating chase called a "tracker" wherein one or more modules are provided; the chase is moved to follow the sun's path such that solar rays are always perpendicular to the lenses.

The direct solar radiation is concentrated by the lenses and is transmitted to the photovoltaic cells which convert it into electrical energy.

The radiation of the lenses to a cloudless night sky causes a high decrease in the temperature of the lenses which, when it comes below the dew point temperature of the air which is contained in the casing, generates the appearance of a first liquid water drop. The lenses have on the internal face thereof a toothed microstructure which is the favoured seat of the liquid condensation and formed condensate trapping mechanism.

Thus, a liquid or solid water film is formed on the internal surface of the lenses, which prevents power generation because of the null direct radiation; the overall yield of the system is thus strongly degraded. Further, as a result, there is a corrosion risk of the silicon seals and the electrical components by the condensate; the life time and the reliability of the system are therefore significantly reduced.

Besides, the increasingly high concentration factor of the systems, for example 1000 times the sun or even more, implies a great casing size, which generates a high air volume per $m^2$ of lenses, making the management of condensation appearance even more difficult.

Several solutions have been suggested to solve this condensation problem.

One of these solutions is described in document US 2011/0154683. This document describes a device for drying the inside of a solar module. This device is provided outside the casing and is connected to the casing so as to allow an air flow between the external environment and the inside of the casing. The device comprises a fan which sucks air from outside, this air passes through a moisture absorber, the air thus dried is introduced into the solar module. To regenerate the absorber, previously heated air passes through it, this air being discharged to the external environment.

This solution has the drawbacks of consuming electrical energy and requiring a maintenance of the fan, heating means and electromagnetic valves.

DISCLOSURE OF THE INVENTION

Consequently, one purpose of the present invention is to provide a device for controlling the moisture level in a concentrating photovoltaic system having a simple and robust design offering a long life time and the operation of which does not consume electrical energy.

The previously set forth purpose is achieved by a device comprising a container intended to be sealingly mounted on a side wall of the casing of the solar module, the receptacle comprising a moisture absorbing material, the receptacle comprising an aperture mounted facing an aperture provided in the casing such that the inside of the receptacle is in fluid communication with the inside of the casing. The device also comprises a shielding element provided facing the aperture of the container and away therefrom so as to provide an open passage between the shielding element and the aperture of the container wherein the air contained in the casing flows by natural convection and passes through the channel from the channel bottom to the casing top. The shielding element enables the absorbing material to be protected from the concentrated solar radiation in case of defocusing the solar module.

The natural convection results from the appearance of a temperature gradient between the lenses that have their temperature decreased during night time because of the radiation to the night sky and the lower part of the casing that does not radiate to the sky.

The air entering the passage is loaded with water vapour, the water vapour is then absorbed by the absorbing material, and the exiting air is water vapour depleted.

The device is wholly passive, it does not require any energy input. Therefore, it does not degrade the overall energy efficiency of the system. It is also actually self-contained and very robust. Further, the absorbing material is protected from the concentrated flux.

It thus has a long life time. It does not demand any maintenance, which is generally complex and expensive for this system which is often implemented in isolated areas. Only the absorbing material can have to be replaced, but this occurs only after several years. Finally, the production cost of this device is relatively low.

Advantageously, the material is hygro-adjusting, thus it enables a given moisture level to be kept within the casing.

Therefore, the subject-matter of the present invention is a device for managing the moisture contained in a casing of a solar module comprising a housing one of the walls of which is provided with a window, at least one moisture absorbing material provided in the housing, shielding means provided facing the window and away therefrom so as to provide a space for the air flow between the window and the shielding means, said shielding means being able to protect the absorbing material from the concentrated solar radiation, said device being intended to be attached to a side wall of the casing of the solar module such that said window faces an aperture made in said side wall ensuring with said window a fluid communication with an internal volume of a solar module and the shielding means being intended to be located inside the solar module.

In an exemplary embodiment, the housing comprises two side walls on either side of the window having a triangular or trapezoidal shape oriented such that the depth of the housing is greatest in its upper part.

The shielding means comprise for example a plate kept distant from the window.

Advantageously, the moisture managing device comprises further protecting means between the shielding means and the housing.

The further protecting means can be located at an upper edge of the plate and are carried by the plate and/or the housing. The further protecting means are advantageously pierced.

Preferably, the further protecting means are painted in black.

The absorbing material is advantageously contained in a flexible pouch. The pouch is preferably adaptable to an increase in volume of the absorbing material.

The pouch can comprise a water vapour impermeable face and a water vapour permeable surface, said permeable face being facing the window.

Advantageously, the absorbing material is hygro-adjusting. It can be $CaCl_2$ in the form of a ball with 1 mm to 4 mm diameter.

The casing can comprise means for retaining said material in the housing so as to avoid that it comes out of the housing. The retaining means can be formed by cross members located at upper and lower zones of the window. Preferably, the cross members are pierced.

Alternatively, the retaining means are formed by bars extending through the window.

Preferably, the external surface of the housing is painted in black.

Another subject-matter of the present invention is a solar module for a concentrating solar system comprising a casing an upper bottom of which is formed by an optical system and a lower bottom opposite to the upper bottom of which is formed by at least one photovoltaic cell and one side wall, and at least one moisture managing device according to the invention, sealably mounted in the side wall so as to seal an aperture provided in the side wall, the window being facing the aperture such that the shielding means are provided inside the casing.

Preferably, the moisture managing device is located at a low position of the module such that the shielding means are not lighted by the concentrated solar radiation when the concentrating solar system is properly focused.

The casing can comprise an air vent sealed by a breathable membrane.

In an exemplary embodiment, the shielding means are attached to the inner face of the side wall and the housing is attached to the external face of the side wall of the casing.

Another subject-matter of the present invention is a concentrating solar system comprising at least one solar module according to the invention.

Another subject-matter of the present invention is a concentrating solar system comprising several solar modules according to the invention.

The solar system is for example of the Fresnel type.

BRIEF DESCRIPTION OF THE DRAWINGS

The present invention will be better understood using the description that follows and the appended drawings wherein.

The terms "lower" and "upper" correspond to the orientation of the drawings in the sheet. The terms "front" and "back" are considered with respect to the moisture managing device, its aperture being provided at the front face. These terms are in no way limiting.

DETAILED DISCLOSURE OF PARTICULAR EMBODIMENTS

Figure 1:
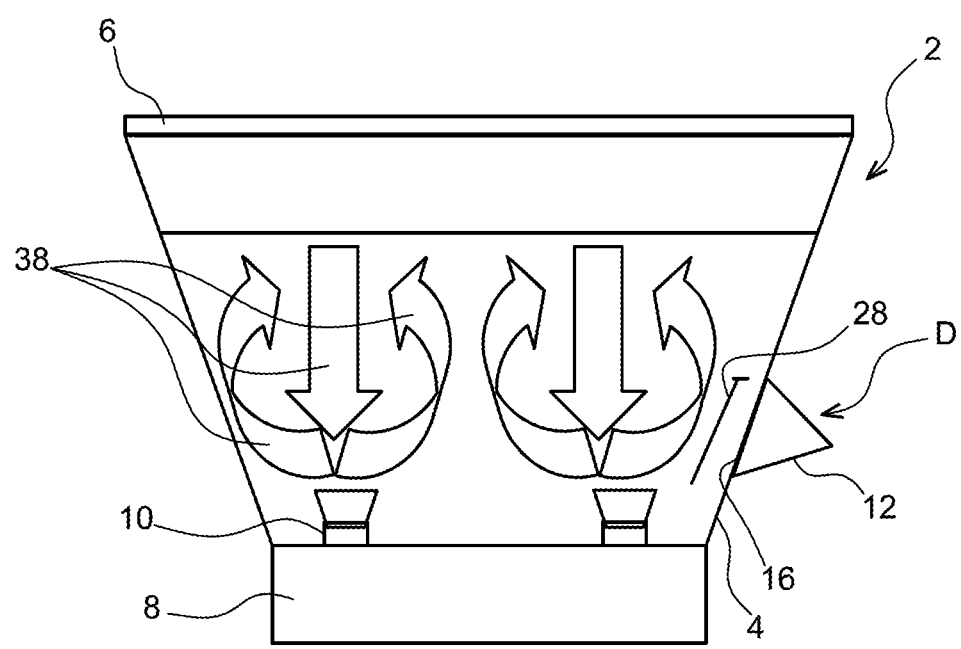
FIG. 1 is a schematic transverse cross section view of an exemplary embodiment of a unit module of a concentrating system equipped with a moisture managing device according to the invention.

FIG. 1 shows a unit module M of a Fresnel lens concentrating system comprising a casing 2 consisting of a side wall 4, an upper bottom 6 and a lower bottom 8.

The upper bottom 6 is formed by the primary optics comprising one or more Fresnel lenses. The lower bottom 8 supports photovoltaic cells 10 for example of the triple junction type. Each lens focuses on a photovoltaic cell 10. Preferably, the photovoltaic cell(s) 10 is (are) provided with heat sinks directed outwardly from the lower bottom 8.

The module M also comprises a device D for managing the moisture inside the casing. The device D is mounted to the side wall 4 of the casing 2.

The moisture managing device D, designated managing device herein after, comprises a housing 12 attached to the side wall of the casing the internal volume of which is in fluid communication with the internal volume of the casing and contains a moisture absorbing material. The absorbing material is preferably provided inside a flexible container, designated "pouch" which will be described in further detail in the following, as well as the absorbing material.

Figure 2A:
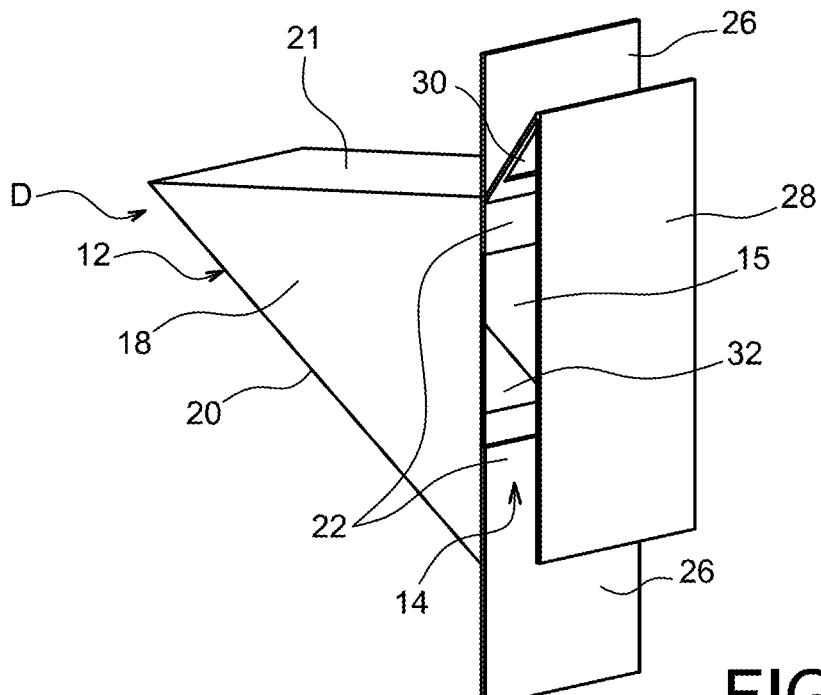
FIG. 2A is a perspective view of an exemplary embodiment of a moisture managing device according to the invention represented alone.
Figure 2B:
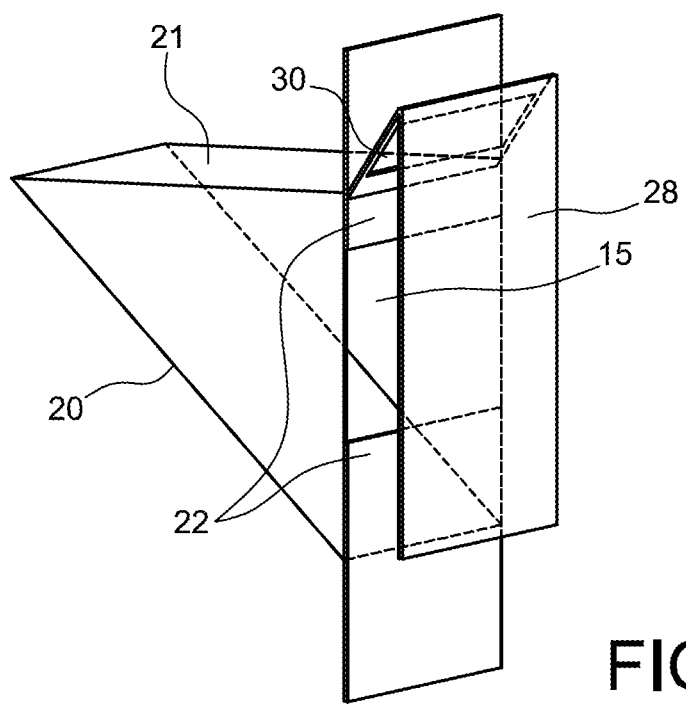
FIG. 2B represents the same view as FIG. 2A, but some parts are transparently visible.

FIGS. 2A and 2B show an exemplary embodiment of the managing device D.

The housing 12 has a front wall 14 provided with a window 15 intended to be provided facing an aperture 16 made in the side wall of the casing 2.

In the example represented, the housing comprises two side walls 18, a back wall 20 tilted with respect to the plane of the front wall 14 and an upper wall 21 perpendicular to the plane of the aperture 15. In this example, the side walls 18 are right angle triangles.

Figure 2C:
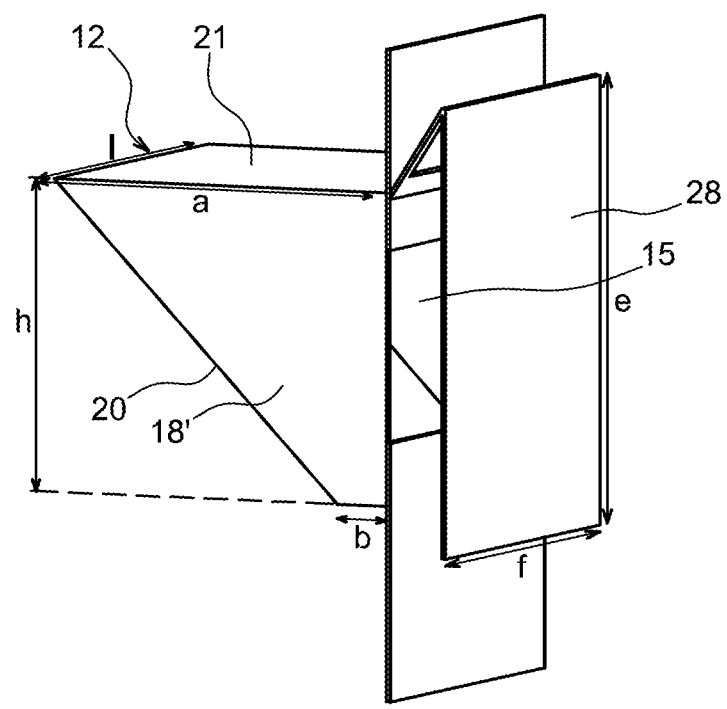
FIG. 2C is a perspective view of another exemplary shape for the housing of the managing device.

FIG. 2C shows a variant embodiment of the housing wherein the side walls 18' are trapeziums, the housing then comprises a lower wall 23 having a smaller area than that of the upper wall 21.

In a further variant embodiment, the side walls could be rectangles one part of the greatest sides of which would define two sides of the aperture. In this variant embodiment, the bottom wall is parallel to the aperture.

The lower and upper edges of the window 15 are formed by lower and upper cross members 22 such that the window 15 has a surface lower than the surface of the front wall 15.

These cross members 22 form means for retaining the pouch inside the housing regardless of the positions of the casing to which the housing is attached, for example during tracking phases where the entire module pivots and is tilted.

FIGS. 3A to 3D show different exemplary shapes of the cross members 22.

Figure 3A:
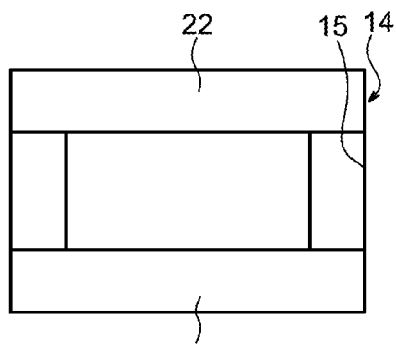
FIGS. 3A to 3D are front views of the moisture managing device according to the invention according to different alternative embodiments, wherein a part called a shielding element or shield has been removed.

FIG. 3A shows solid cross members.

Figure 3B:
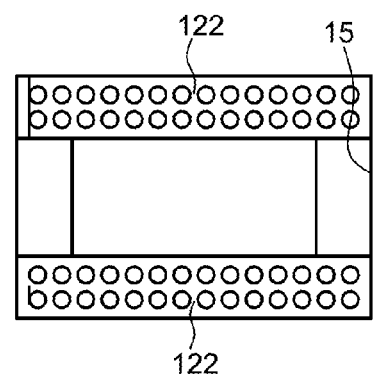
Figure 3C:
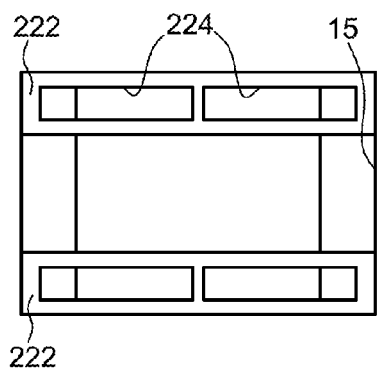

FIGS. 3B and 3C shows advantageous variant embodiments wherein the impact of the cross members onto the surface of the aperture is reduced. For this, in FIG. 3B, the cross members 122 are pierced. In FIG. 3C, the cross members 222 each comprise two large recesses 224 side by side along the width of the window 15.

A device comprises for example a cross member of FIG. 3A and a cross member of FIG. 3B or 3C does not depart from the scope of the present invention.

Figure 3D:
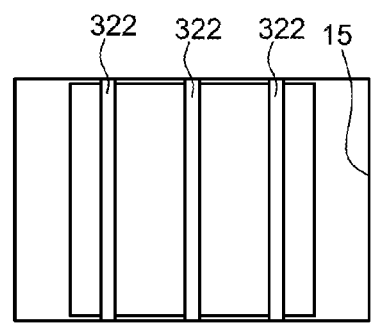

FIG. 3D shows another exemplary embodiment wherein the retaining means are no longer formed by horizontal cross members but by vertical bars 322 forming a rack. In this example, the impact on the surface of the aperture is dramatically reduced.

The bars are not necessarily straight. Further, they can be tilted or horizontal. Finally, it could be contemplated to implement a lattice or a wire meshing.

The device of FIG. 2A also comprises means 26 for attaching the housing to the side wall of the casing 2. In the example represented, the front face 14 has a length higher than the height of the side wall, thus the front wall comprises an upper wing and a lower wing. Alternatively, the housing could be integrated in the side wall 4 of the casing, thus the upper and lower wings would not be required any longer.

The device also comprises a shielding element 28 or shield mounted facing the aperture 15 distant therefrom, outside the housing such that, when the device is mounted to the casing, the shield 28 is located inside the casing. The protecting shield 28 is intended to shield the concentrated solar rays for the pouch, so as to avoid, in case of defocusing, pouch burning by the concentrated rays, while allowing the air flow along the aperture 15.

Advantageously and as represented in FIG. 2B, the device comprises means 30 ensuring further protection against defocusing without disturbing air flow.

In FIG. 2A, these means are formed by the upper edge of the shield 28 which is folded towards the window and is secured to the receptacle at the upper cross member 22. The folded edge 28.1 is provided with one or more ports in a similar way as the cross members 222 of the FIG. 3C, in order to allow an air flow through the folded edge.

FIGS. 4A to 4E shows several exemplary embodiments of the further protecting means.

Figure 4A:
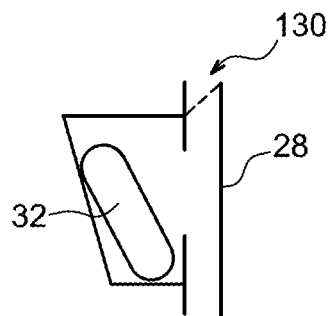
FIGS. 4A to 4E are cross section views of the moisture managing device according to the invention showing different alternative embodiments of the shield.

FIG. 4A shows the folded edge 130 which is different from the folded edge of FIG. 2A in that it is pierced.

Figure 4B:
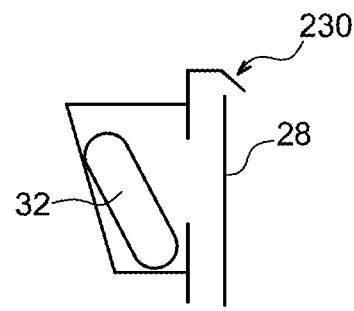

In FIG. 4B, the further protecting means 230 are formed by a metal plate attached to the front wall 14 of the housing and folded so as to wrap the upper edge of the shield which is formed by a planar plate, wherein the air can flow between the plate and the upper edge of the shield.

Figure 4C:
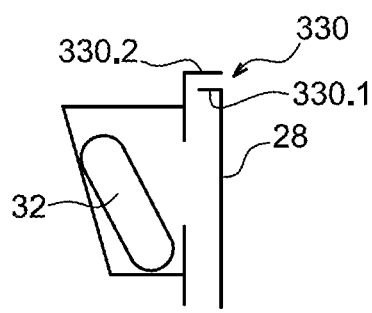

In FIG. 4C, the further protecting means 330 are distributed on the housing 12 and on the shield 28. For this, the upper edge 330.1 of the shield 28 is folded at right angle to the front wall of the housing 12 and the housing 12 comprises a metal plate 330.2 which is at right angle with the front wall 14. During assembly, the metal plate 330.2 is located above the folded edge 330.1 of the shield 28.

Figure 4D:
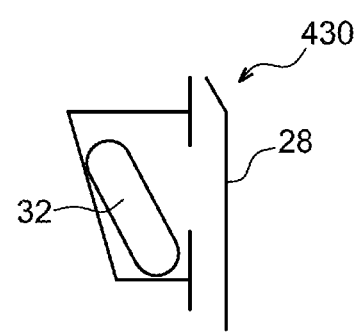
Figure 4E:
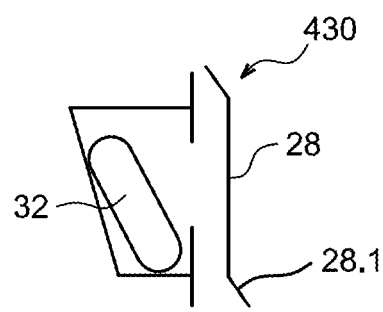

In FIGS. 4D and 4E, the further protecting means 430 are formed by the upper edge of the shield 28 folded to the front wall 14 of the housing such that it forms an angle between 0° and 90° with respect to its position before folding.

In FIG. 4E, the lower edge 28.1 is also folded but on the opposite side to that of the upper edge with respect to the plane of the shield. This folded edge 28.1 facilitates air flow.

The absorbing material will now be described.

For example, this is a silica gel, a zeolite molecular sieve, Montmorillonite type clay, activated alumina, calcium sulphate.

Very advantageously, the absorbing material is an absorbing and hygro-adjusting material, which results in keeping some moisture level.

Such materials have absorbing capacities and variable functional reversibilities. By "reversibility" it is intended the capacity of the chemical compound to absorb and desorb a water vapour under given temperature conditions.

For example, the maximum moisture rate to avoid the appearance of condensation has been assessed to about 40%. A hygro-adjustment about this value and variation amplitudes between 30% and 50% enable such a humidity rate to be kept. For example, calcium chloride has a hygro-adjusting power between 40% and 50% relative moisture.

The material is for example as a powder, granules, balls or gel.

Figure 5:
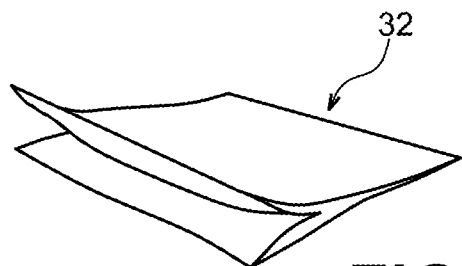
FIG. 5 is a perspective view of an exemplary container for the moisture absorbing material.

The container is flexible and is such that it accommodates variations in the volume of the material. For example, the container is a bellow pouch 32 such as represented in FIG. 5.

Further, the pouch comprises for example a face made of a water proof material, for example a plastic film and a face made of a water vapour permeable material, of the breathable membrane type. The permeable membrane forms the active surface of the pouch and is intended to be directed in front of the window 15.

FIGS. 4A to 4E show the arrangement of the pouch 32 in the housing. The pouch is provided in the housing such that its permeable face is in front of the aperture 15.

In order to promote the regeneration of the absorbing and hygro-adjusting material, the housing is advantageously covered on its external surface with a black coating so as to bring the heat behaviour of the housing closer to that of a black body. The housing then absorbs most of the external radiation and heats the absorbing material it contains and subjects it to a temperature range close to the reversibility range of the material, that is the temperature range wherein the regeneration of the absorption capacity of the material occurs, when moisture gradient conditions between the ambient air of the casing and the absorbing pouch air allow it.

Thus, the saturated state of the material is delayed, which lengthens the time between two material replacements.

An exemplary method for making a managing device will now be described using FIGS. 6A to 6E.

In this example, the shield and housing are mounted separately to the casing.

The shield 28 is made separately and then attached to the internal face of the side wall of the casing facing the aperture.

The shield 28 is attached to a support 34 in the form of a frame and away therefrom, by which it is attached to the side wall 4 of the casing 2 about the aperture 16. The shield 28 is attached to the frame by welded pins 36. The height of the pins defines the thickness of the air layer intended to flow between the shield and the window.

Figure 6A:
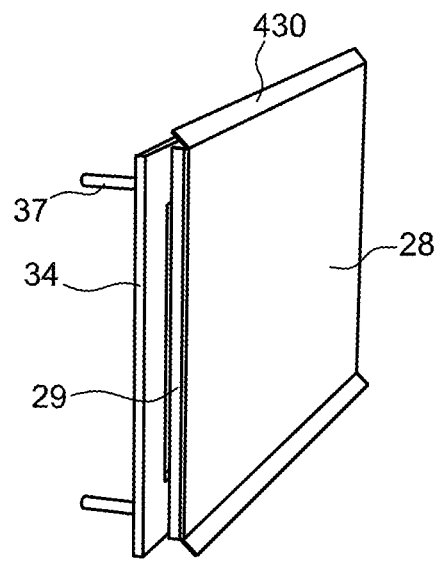
FIGS. 6A to 6E are views of different elements at different manufacturing stages of a managing device such as that of FIG. 2A.

Advantageously, the shield also comprises two side wings 29 tilted to the housing as can be seen in FIG. 6A and forming a further protection in case of defocusing.

As previously described, the shield comprises two side wings 29 and further protecting means 430, and a folded lower edge to facilitate air flow.

In the example represented, the frame 34 also comprises six threaded rods 37 or studs attached to its face opposite to that attached to the shield. The circumference of the casing aperture is pierced with holes corresponding to the location of the studs on the frame.

The shield 28 and frame 34 assembly is introduced in the casing 2 by the aperture provided to that end in the side wall of the casing. Then, the studs 37 are introduced in holes 38 of the perimeter of the aperture. The studs 37 then project outwardly from the casing 2 (FIG. 6E).

The housing can for example be made of a thermo-set polymer or a folded metal plate.

In this example, the housing 12 is provided with attaching surfaces surrounding its entire aperture. The attaching surfaces are provided with holes for the studs to pass therethrough. These surfaces are applied against the external face of the side wall 4 of the casing 2 such that the studs 37 penetrate in the holes of the attaching surfaces. Then, nut-locknut systems ensure securement.

Sealing means are provided between the housing 12 and the casing 2, these means are in particular water vapour proof. A proofness is also provided at the threads through the casing 2, for example using proof tubes.

The housing 12 can be made by drawing or jointed by welding.

Figure 6B:
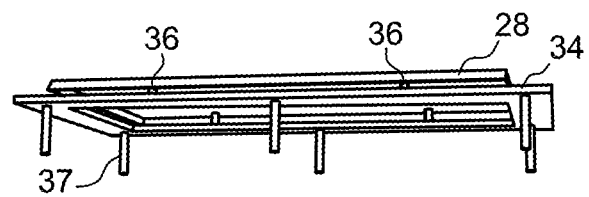
Figure 6C:
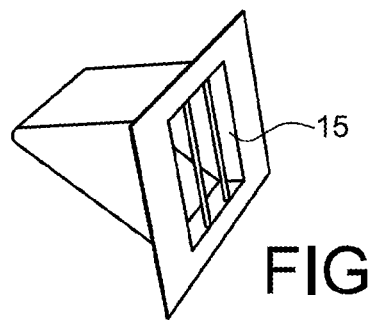
Figure 6D:
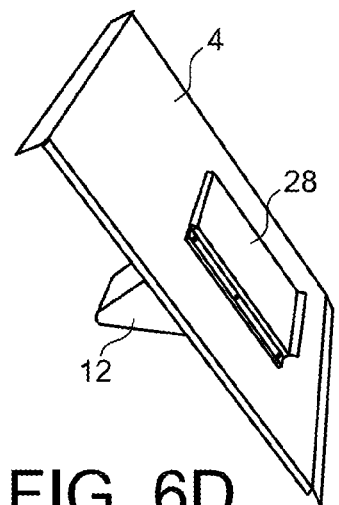
Figure 6E:
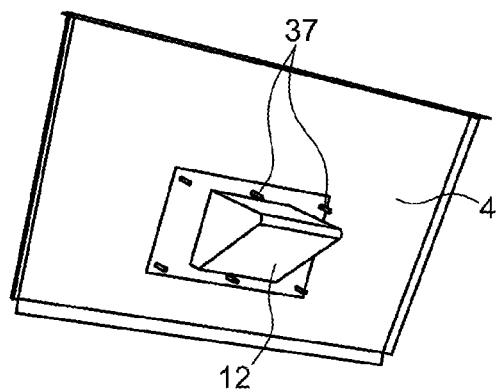

In another variant embodiment, pins are directly welded to the internal face of the side wall on which the shield is attached, avoiding to use a frame as in FIG. 6B.

It can also be contemplated to make the entire device beforehand and to attach it to the casing. For example, the housing would be provided with a flange for attaching to the casing and studs would be welded to the external face of the casing for attaching the flange. Sealing means would be interposed between the flange and the casing.

Figure 7:
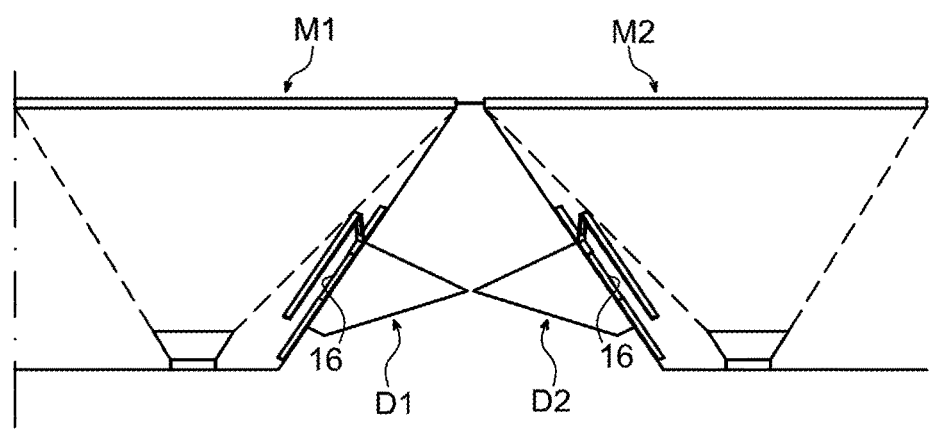
FIG. 7 is a longitudinal cross section view of two modules each provided with a moisture managing device according to the invention.

FIG. 7 shows two modules M1 and M2 arranged side by side and each equipped with a moisture managing device D1, D2.

In the example represented, both managing devices D1, D2 are at substantially the same height. It could be contemplated that they are at two different heights.

Further, preferentially, the managing device is mounted on the low part of the casing such that the shield is not lighted by the concentrated solar flux, which avoids to reduce the flux seen by the cell. Further, the shield is also protected. The solar flux is bounded by broken lines.

The operation of the managing device will now be described using FIG. 1.

In FIG. 1, the air movements by natural convection are represented by arrows 38.

The representation selected is that of the time of night end and morning start, the time when the temperature of the upper bottom 6 of the casing made up of lenses is coldest and might fall below the dew point temperature. The local cooling occurring in the vicinity of the toothed microstructure of the Fresnel lenses at the primary optics comes from heat losses due to thermal radiation to the sky during night time. Furthermore, the low optical absorptivity and high optical transmittivity of the lenses prevent the incident solar flux from locally heat the air.

But the lower bottom 8 comprising photovoltaic cells undergoes a local heating due to the action of the sinks and the bottom steel plate which are subjected to the local air movements at room temperature.

Therefore, a thermal gradient appears in the internal volume of the module which induces air mass transfers which drive air convection mechanisms. Furthermore, moist air is lighter than dry air.

Air flows symbolized by arrows 38 thus occur in proximity of the housing containing the absorbing material.

Thus, there is a moist air flow upwardly between the shield 28 and the window 15 of the housing 12. Water vapour contained in the air is absorbed by the absorbing material through the permeable membrane. The air exiting therefrom is then dried.

The absorbing material, by absorbing water vapour increases in volume, the wrapping is unfolded to fit to the volume of the absorbing material.

In the case of a hygro-adjusting absorbing material, during day time when the temperature in the housing sufficiently increases, the material is regenerated by releasing water vapour in the casing and provides for keeping a moisture level substantially constant in the casing.

Preferentially, the absorptivity of the shield plate is increased, for example by covering it with black paint, in order to generate a hot zone and thus promote air flows by convection in proximity of the device.

Preferably, the housing comprises triangular or trapezoidal side walls which enable the surface permeable to water vapour to be increased. Indeed, the active surface is substantially equal to that of the bottom wall, in the case of FIGS. 2A and 2C, its surface is higher than that of a rectangular housing. Further, these shapes offer a large volume to accommodate the increase in volume of the absorbing material.

Figure 8:
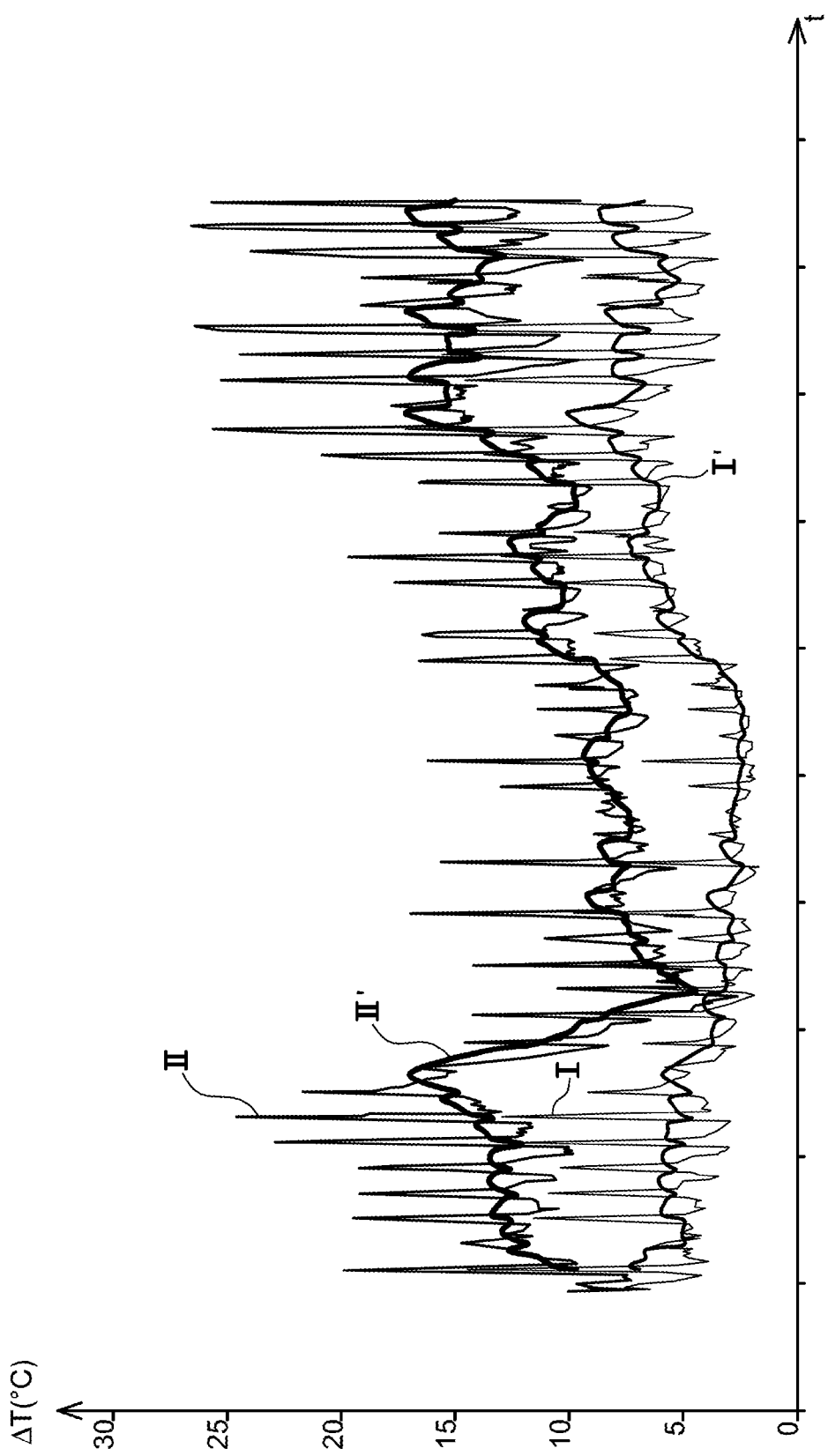
FIG. 8 is a graphical representation of the temperature difference between that of the air contained in the module and the dew point temperature as a function of time in days of this air for a module with a managing device according to the invention and a module without managing device.

FIG. 8 shows, represented by curves I and II, the temperature difference $\Delta T$ in ° C. as a function of time in days between the casing air and the dew point temperature of this same air in the case of a module without managing device according to the invention and a module with a managing device according to the invention respectively. Curves I' and II' represent the moving average of curves I and II respectively.

The higher the temperature difference, the lower the risk of condensation appearance, given that the lens temperature is in the early hours a few degrees lower than that of the casing air, because of the lens radiation to the sky, for example by 2° C. to 5° C. for a clear sky. Thus, in view of the temperature differences represented by curve II, if a lens temperature of 2° C. to 5° C. is considered, with respect to that of the casing air, it still remains very higher than that of the dew point temperature.

The efficiency of the managing device according to the invention can thus be observed.

By way of example, a pouch of about 1 kg of absorbing and hygro-adjusting material has a life time in the order of 15 years.

The pouch can be replaced by disassembling the housing by unscrewing the nuts on the studs. A trap could optionally be provided in the bottom of the housing to make the pouch replacement easier.

By way of example, the device can have the dimensions gathered in table T1 below by taking as a reference:
H, the height of the casing 2 of the module M;
L, the length of the casing 2 at its upper bottom 6.
The dimensions h, l, a, b, e, f are represented in FIG. 2C.

TABLE T1

| dimensions of the device of FIG. 2C | |
|---|---|
| Dimension of the housing | |
| h | $0.1 \times H < h < 0.5 \times H$ |
| l | $0.1 \times L < h < 0.9 \times L$ |
| a | $0.25 \times h < a < 1 \times h$ |
| b | $0 < b < 1 \times a$ |
| Dimension of the shield | |
| e | $1 \times h < e < 2 \times h$ |
| f | $1 \times l < f < 2 \times$ |
| Thickness of the walls | |
| Wall thickness | 0.5 mm < Wall thickness < 2 mm |
| Thickness of the air blade between the aperture of the housing and the shield | |
| Air blade thickness | 5 mm < Air blade thickness < 50 mm |

In the example represented, the housing 12 of the device D is wholly located outside the casing 2. Alternatively, it could be contemplated that only one part of the housing be provided outside the casing.

The casing may also comprise a vent sealed by a so-called breathable membrane, allowing air and water vapour to pass but not liquid water.

Further, a module can comprise one or more moisture managing devices as a function of the air volume of the module.

The heat managing device further has the advantage to be easily mountable on existing modules without requiring complex adaptability.

The moisture managing device is applicable to all the concentrating solar systems.

What is claimed is:

1. A moisture managing device for managing the moisture contained in a casing of a solar module,
said moisture managing device comprising:
   a housing comprising walls, one of the walls being provided with a window,
   at least one moisture absorbing material provided in the housing,
   a shield provided facing the window and away therefrom so as to provide a space for the air flow between the window and the shield, said shield being able to protect the absorbing material from the concentrated solar radiation, said device being configured to be attached to a side wall of the casing of the solar module such that said window faces an aperture made in said side wall ensuring with said window a fluid communication with an internal volume of a solar module and the shield being configured to be located inside the solar module.

2. The moisture managing device according to claim 1, wherein the housing comprises two side walls on either side of the window having a triangular or trapezoidal shape oriented such that the depth of the housing be greatest in its upper part.

3. The moisture managing device according to claim 1, wherein the shield comprises a plate kept distant from the window.

4. The moisture managing device according to claim 3, comprising an additional shield between the shield and the housing.

5. The moisture managing device according to claim 4, wherein the additional shield is located at an upper edge of the plate and is carried by the plate, the housing, or both.

6. The moisture managing device according to claim 5, wherein the shield is pierced.

7. The moisture managing device according to claim 4, wherein the said additional shield is painted black.

8. The moisture managing device according to claim 1, wherein the absorbing material is contained in a flexible pouch.

9. The moisture managing device according to claim 8, wherein the pouch is adaptable to an increase in volume of the absorbing material.

10. The moisture managing device according to claim 8, wherein the pouch comprises a water vapor impermeable face and a water vapor permeable surface, said permeable face being facing the window.

11. The moisture managing device according to claim 1, wherein the absorbing material is hygro-adjusting.

12. The moisture managing device according to claim 11, wherein the absorbing material is $CaCl_2$ in the form of a ball with 1 mm to 4 mm diameter.

13. The moisture managing device according to claim 1, wherein the housing comprises a retainer for retaining said material in the housing so as to avoid that it comes out of the housing.

14. The moisture managing device according to claim 13, wherein said retainer is formed by cross members located at upper and lower zones of the window.

15. The moisture managing device according to claim 14, wherein the cross members are pierced.

16. The moisture managing device according to claim 13, wherein said retainer is formed by bars extending through the window.

17. The moisture managing device according to claim 1, wherein the external surface of the housing is painted black.

18. A solar module for a concentrating solar system comprising:
a casing comprising:
an upper bottom including an optical system,
a lower bottom which is opposite to the upper bottom and which comprises at least one photovoltaic cell, and
at least one casing side wall provided with an aperture,
   at least one moisture managing device according to claim 1, mounted on the at least one casing side wall provided with the aperture, sealing the aperture provided in the at least one casing side wall, the moisture management device window facing the casing side wall aperture, wherein the shield is provided inside the casing.

19. The solar module according to claim 18, wherein the moisture managing device is located at a position of the module wherein the shield is not lighted by the concentrated solar radiation when the concentrating solar system is properly focused.

20. The solar module according to claim 18, wherein the casing comprises an air vent sealed by a breathable membrane.

21. The solar module according to claim 18, wherein the shield is attached to the inner face of the side wall and the housing is attached to the external face of the side wall of the casing.

22. A concentrating solar system comprising at least one solar module according to claim 18.

23. A concentrating solar system comprising several solar modules according to claim 18.

24. The concentrating solar system according to claim 22, being of the Fresnel type.

* * * * *